United States Patent [19]

Duttweiler et al.

[11] Patent Number: 4,468,641
[45] Date of Patent: Aug. 28, 1984

[54] ADAPTIVE FILTER UPDATE NORMALIZATION

[75] Inventors: Donald L. Duttweiler, Rumson; Charles W. K. Gritton, North Brunswick; Ying G. Tao, Old Bridge, all of N.J.

[73] Assignee: AT&T Bell Laboratories, Murray Hill, N.J.

[21] Appl. No.: 393,124

[22] Filed: Jun. 28, 1982

[51] Int. Cl.$^3$ ............................................. H03H 15/00
[52] U.S. Cl. ................................. 333/166; 333/17 R; 333/17 L; 333/174
[58] Field of Search ................................. 333/165–167, 333/17 R, 17 L, 138–140, 174; 328/167–168, 155, 162, 163, 165, 166, 150–151; 364/724; 179/170.2, 170.8

[56] References Cited

U.S. PATENT DOCUMENTS

| | | |
|---|---|---|
| 3,922,505 | 11/1975 | Hoge ................................. 179/170.2 |
| 3,967,102 | 6/1976 | McCown ......................... 333/174 X |
| 4,417,317 | 11/1983 | White et al. ...................... 333/165 X |

OTHER PUBLICATIONS

"A Twelve-Channel Digital Echo Canceler" by Donald L. Duttweiler, IEEE Transactions on Communications, vol. COM-26, No. 5, pp. 647–653, May 1978.

Primary Examiner—Marvin L. Nussbaum
Attorney, Agent, or Firm—Thomas Stafford

[57] ABSTRACT

Loop gain normalization is employed in adaptive filters to control weighting of the filter characteristic updates in order to converge properly to a desired filter characteristic. Filter stability and rapid high quality convergence is realized for a variety of received or inputted signals by employing both long term and fast attack estimates of a prescribed input signal characteristic to normalize the update gain. In one embodiment, both long term and fast attack input signal power estimates are generated and one of the two estimate values is selected to normalize the update gain. Specifically, the fast attack estimate is modified by a predetermined value and, then, the larger of the long term estimate and modified fast attack estimate is selected to normalize the update gain.

9 Claims, 4 Drawing Figures

ADAPTIVE FILTER UPDATE NORMALIZATION

RELATED APPLICATIONS

Copending application, Ser. No. 393,122, was filed concurrently herewith.

TECHNICAL FIELD

This invention relates to adaptive filters and, more particularly, to updating of the filter characteristic during reception of prescribed signals.

BACKGROUND OF THE INVENTION

Adaptive filters operate on a signal supplied thereto in accordance with a prescribed criterion to generate a desired output signal. Typically, the filters generate a transfer function (an impulse response characteristic) in accordance with an algorithm which includes updating of the transfer function characteristic in response to an error signal. In this way the filter characteristic is optimized to yield the desired result.

It has been found advantageous to normalize the update gain of the adaptive filter. The normalization serves to make the performance of the filter insensitive to variations in received signal power. In one prior arrangement an average of the squares of input signal sample magnitudes is used to normalize the gain, as described in an article by Mr. D. L. Duttweiler entitled "A Twelve-Channel Digital Echo Canceler", *IEEE Transactions on Communications*, Vol. COM-26, No. 5, May 1978, pp. 647-653. Another gain normalization arrangement employing a sum of the squares estimate is disclosed in U.S. Pat. No. 3,922,505 issued Nov. 25, 1975.

Although these prior arrangements perform satisfactorily in some applications, poor performance or possibly instability results when the received signal includes transient signals, rapidly pulsating signals or the like. In telephone applications, instability may result in echo canceler filters for busy signal, telephone signaling tones, other pulsating signals, data sets coming and going, or the like. The poor performance results because the average power estimate used in prior arrangements is relatively small for the transient signals thereby generating an update gain which is too large. Even if the filter does not become unstable, at best very poor convergence results, i.e., the characteristic converged to does not closely represent the desired characteristic. These results are undesirable.

One attempt at overcoming the undesirable effects of prior update gain normalization arrangements is disclosed in U.S. patent application, Ser. No. 393,122 filed concurrently herewith. This arrangement employs a so-called fast attack estimate of a prescribed characteristic of the received signal to normalize the update gain. In one embodiment the fast attack estimate is the maximum of representations of magnitudes of a plurality of input signal samples. Although use of the fast attack estimate minimizes undesirable effects during reception of transient signals, it does not result in the best update gain for other signal conditions, for example, single tones, or noise.

SUMMARY OF THE INVENTION

The problems of prior update gain normalization arrangements are overcome, in accordance with an aspect of the invention, by employing estimates of first and second prescribed characteristics of a received signal and controllably selecting between the estimates in accordance with prescribed criteria in order to optimize the update gain normalization. In one embodiment, long term, i.e., average, and fast attack estimates of input signal power are generated and one of the estimates is selected in accordance with the prescribed criteria for normalizing the update gain. Specifically, the fast attack estimate is modified by a predetermined value and, then, the larger of the modified fast attack and average power estimates is selected for normalizing the update gain.

BRIEF DESCRIPTION OF THE DRAWINGS

The invention will be more fully understood from the following detailed description of an illustrative embodiment taken in connection with the appended figures in which.

DETAILED DESCRIPTION

Figure 1:
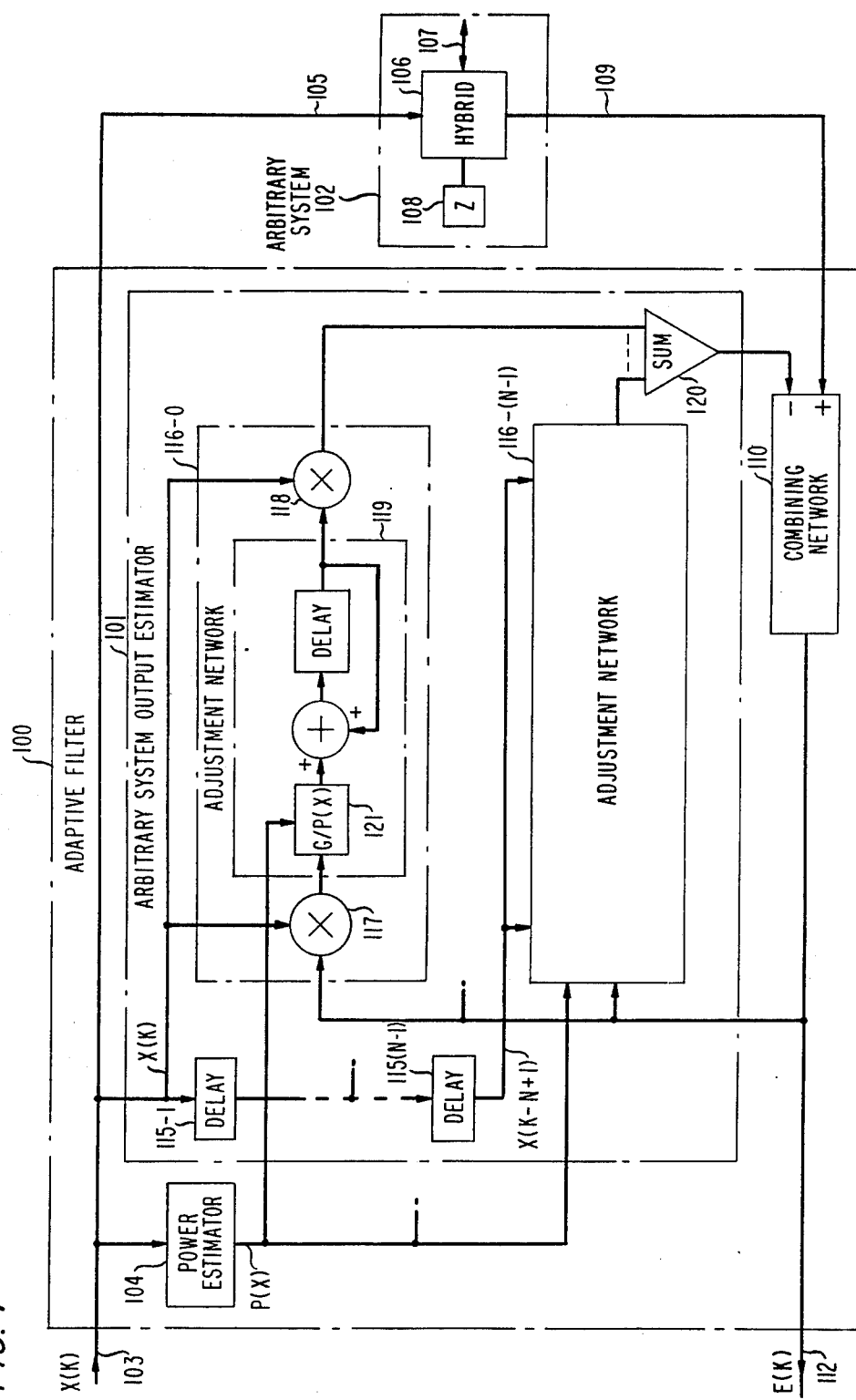
FIG. 1 shows in simplified block diagram form an adaptive filter including an embodiment of the invention.

Adaptive filter 100 including an embodiment of the invention is shown in simplified block diagram form in FIG. 1. Adaptive filter 100 is broadly similar to the adaptive filter used in echo cancelers disclosed in U.S. Pat. Nos. 3,499,999 and 3,500,000. Briefly, adaptive filter 100 includes an adjustable signal processor having a closed loop error control system which is self-adapting in that it automatically tracks signal variation in an outgoing path. More specifically, filter 100 employs system output estimator 101 including an adaptive transversal filter arrangement for synthesizing a linear approximation of arbitrary system 102.

To this end, far end incoming signal X(K) is usually supplied from a far end signal source over a first transmission path, e.g., lead 103, to a first input of filter 100 and therein to an input of power estimator 104 and to an input of arbitrary system output estimator 101. Far end signal X(K) may be, for example, a digitally sampled speech signal, where K is an integer identifying the sampling interval. Far end signal X(K) is also supplied via lead 105, perhaps through some conversion circuitry, e.g., a digital-to-analog converter not shown, to arbitrary system 102. In an echo canceler application, arbitrary system 102 includes hybrid 106, matching impedance 108 and bidirectional transmission path 107. It is usually desirable for the input signal to hybrid 106 from lead 105 to be supplied over bidirectional path 107 to a near-end listening party. However, because of an impedance mismatch in hybrid 106, typically caused by balance impedance 108 not exactly matching the impedance of bidirectional path 107 a portion of the hybrid input signal appears on outgoing lead 109 and is reflected to the far end signal source as an echo signal. Similarly, any arbitrary system 102 will generate a system output signal which differs from that generated by estimator 101 until adaptive filter 100 converges to the arbitrary system characteristic. The output of arbitrary system 102 is, therefore, equivalent to the echo signal in an echo canceler application. The output signal of arbitrary system 102 is supplied over lead 109 to another input of filter 100 and therein to a first input of combining network 110. Lead 109 may also include conversion apparatus, e.g., an analog-to-digital converter not shown. A second input to combining network 110 is a signal estimate of the arbitrary system output signal generated by estimator 101. The arbitrary system output estimate is supplied via lead 111 from an output of estimator 101 to the second input of combining network 110. Combining network 110 generates error signal E(K) corresponding to the algebraic difference between the arbitrary system output estimate from estimator 101 and the output from arbitrary system 102. Error signal E(K) is supplied over a second transmission path, e.g., lead 112 to the far end source and to estimator 101.

Estimator 101 includes a so-called tapped delay line comprised of delay units 115-1 through 115-(N−1) (a shift register) for realizing desired delays at the taps corresponding to convenient Nyquist intervals. Therefore, delayed replicas X(K−1) through X(K−N+1) of incoming far end signal X(K) are generated at the corresponding taps. The signal at each tap position, namely X(K−1) through X(K−N−1) as well as X(K), is adjusted in response to error signal E(K). More particularly, signals X(K) through X(K−N+1) are individually weighted in response to E(K) via a corresponding one of adjustment networks 116-0 through 116-(N−1), respectively. Adjustment networks 116-0 through 116-(N−1) each include multipliers 117 and 118, and feedback loop 119. Feedback loop 119 adjusts the tap weight to a desired value in a manner which will be apparent to those skilled in the art and explained in the above-noted references. In this adjustment, it is important to appropriately adjust the individual loop gains (G) to result in a stable system. This is realized by normalizing loop gain G by dividing it with an estimate of a prescribed characteristic of input signal X(K). In this example, an estimate of input signal power P(X) is employed as a normalization control signal and generated by power estimator 104. Normalization control signal P(X) is supplied to controllable gain unit 121 in each of adjustment networks 116. See for example, the article entitled "A Twelve-Channel Digital Echo Canceler" noted above which discloses use of an average, i.e., long term estimate P(X) of the power of X(K) to normalize loop gain G, namely, G/P(X). The weighted replicas, i.e., amplitude coefficient signals of X(K) from adjustment networks 116-0 through 116-(N−1) are summed via summing network 120 to generate the arbitrary system output or echo estimate signal approximating the output from arbitrary system 102 or the echo to be canceled. The arbitrary system output estimate is supplied via lead 111 to the second input of combining network 110.

Figure 2:
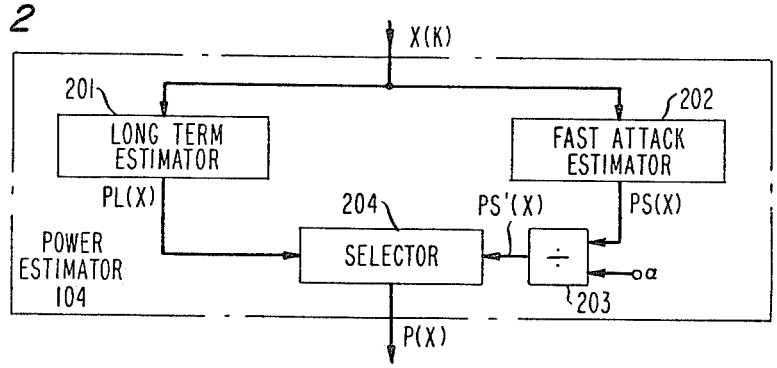
FIG. 2 depicts in simplified form details of one embodiment of the power estimator employed in FIG. 1.

FIG. 2 shows in simplified block diagram form one embodiment of power estimator 104 which may be utilized, in accordance with an aspect of the invention, for generating first and second representations of estimates of prescribed characteristics of received signal X(K) and selecting one of the estimates in accordance with prescribed criteria as normalization control signal P(X). In this example, not to be construed as limiting the scope of the invention, the prescribed characteristics of signal X(K) are long term PL(X) and fast attack PS(X) power estimates, respectively.

As discussed above, use of long term, i.e., average, estimate PL(X) of received signal power has undesirable effects under certain received signal conditions. Similarly, use of fast attack estimate PS(X) of received signal power also has undesirable effects under certain received signal conditions. Specifically, when generating the fast attack power estimate using an approximation approach the crest or peak factor employed is selected for a specific type of received signal, either speech, sine waves or noise. If the crest or peak factor is selected for speech, as described in copending application, Ser. No. 393,122 it is not the correct value when sine waves, i.e., single frequency tones, or noise is being received. For example, the speech crest or peak factor value is too large for sine waves and the normalization control signal P(X) is too small causing a higher normalized update gain. The higher update gain tends to cause the filter performance to be degraded. This problem is overcome, in accordance with an aspect of the invention, by employing both the long term power estimate and the fast attack power estimate, and selecting one of the two in accordance with prescribed criteria as the normalization control signal P(X). Specifically, the larger of the long term estimate and a modified version of the fast attack estimate is selected to be P(X). Consequently, the update gain (G) is always divided by the larger of the power estimates which results in a lower update gain and a more stable, higher quality convergence of the adaptive filter. Thus, improved stability is realized for transient signals while maintaining high performance for other signals.

Figure 3:
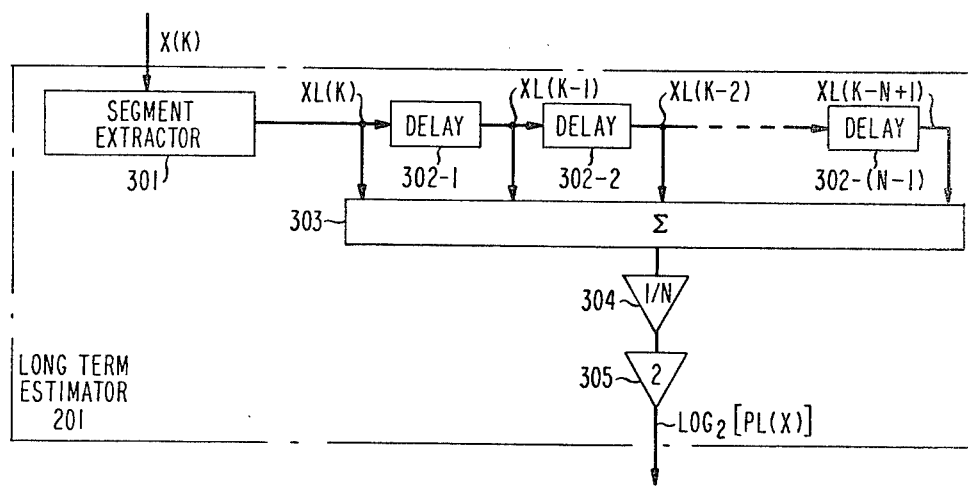
FIG. 3 shows in simplified block diagram form details of the long term estimator employed in the power estimator of FIG. 2.
Figure 4:
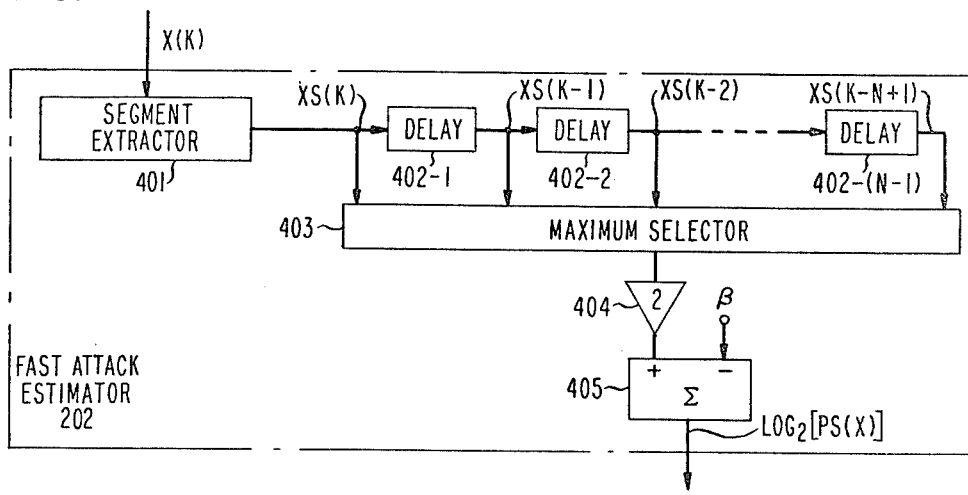
FIG. 4 shows in simplified block diagram form details of the fast attack estimator employed in the power estimator of FIG. 2.

Accordingly, shown in FIG. 2 are long term estimator 201, fast attack estimator 202, divider 203 and selector 204. As indicated above, the estimate of the prescribed input signal characteristic estimates employed in this embodiment are the long term and fast attack power estimates, namely, PL(X) and PS(X) respectively. Long term power estimate PL(X) of X(K) is generated by long term estimator 201 and fast attack power estimate PS(X) is generated by fast attack estimator 202. Details of embodiments of estimators 201 and 202 are shown in FIGS. 3 and 4, respectively, and described below. Divider 203 is employed to modify, magnitude scale, fast attack estimate PS(X) by a prescribed value γ to generate a modified version of PS(X), namely, PS'(X). Modifying PS(X) insures that the quality long term estimate is selected most of the time, except when a transient signal condition exists. That is to say, the fast attack estimate is selected only when sudden changes in received signal X(K) causes modified fast attach estimate PS'(X) to exceed the long term estimate PL(X). In one example, PS(X) is modified via divider 203 by subtracting the $\log_2 \gamma$ from the $\log_2[PS(X)]$ to generate PS'(X) where γ is 6 dB. As is well known, subtraction of logarithms is the same as dividing and, then, a simple anti-logarithm would yield PS'(X). Selector 204 is employed to select, in accordance with a prescribed criterion, either the long term estimate PL(X) or modified fast attack estimate PS(X) to be used as the update gain normalization control signal P(X). In this embodiment, the prescribed criteria is to modify fast attack estimate PS(X) and to select the larger value of long term estimate PL(X) and modified fast attack estimate PS'(X). The selection in this example, is between the $\log_2 PL(X)$ and $\log_2 PS'(X)$ and is achieved in well known fashion. The normalization control signal P(X) from selector 204 is supplied to controllable gain unit 121 in each of adjustment networks 116 to normalize the update gain, namely, G/P(X). In one example, $\log_2 P(X)$ is supplied to gain unit 121 in each of adjustment networks 116 (FIG. 1) to be subtracted from $\log_2 G$ and a simple antilogarithms yields G/P(X).

FIG. 3 shows in simplified form one embodiment of long term estimator 201 for generating an estimate of a first prescribed characteristic of X(K), namely, a so-called long term power estimate PL(X). Input signal X(K) is typically samples of a signal in digital form, each being representative of a μ-law quantized amplitude sample. Typically, the sampling rate is 8 kHz and N=128. Each such digital sample representation includes a sign bit, three segment bits and four step bits.

It is desired to generate a mean square estimate of the power of X(K), namely $$PL(X) = \frac{1}{N} \sum_{i=0}^{N-1} X^2(K - i) \tag{1}$$

where in this example N=128. However, it has been determined that for this application a geometric mean square estimate is sufficiently close to the desired long term power estimate, namely, $$PL(X) = \left[ \sqrt[N]{\prod_{i=0}^{N-1} X(K - i)} \right]^2 \tag{2}$$

It is also known that summing is easier to achieve than multiplication or squaring. Additionally, it is known that for μ law digital sample representations the segment bits are an approximate representation of the log base 2 of the corresponding sample magnitudes, see for example, U.S. Pat. No. 4,189,715 issued to D. L. Duttweiler on Feb. 19, 1980.

Accordingly, as shown in FIG. 3, received signal sample X(K) is supplied to segment extractor 301 for obtaining the segment bits of the received samples. This is readily realized by employing a corresponding plurality of gates which are enabled to pass only the three segment bits to delay elements 302-1 and, in turn, to delay elements 302-2 through 302-(N−1). Delay elements 302 may be a shift register for storing N delayed replicas of the segments bits XL(K), namely, XL(K−1) through XL(K−N+1). As described above, segment bits XL(K) through XL(K−N+1) are approximately representative of the logarithms of the magnitudes of the corresponding samples. Signals XL(K) through XL(K−N+1) are supplied to summer 303. Since XL(K) through XL(K−N+1) are representative of the log base 2 values of the corresponding sample magnitudes, summer 303 generates a signal representative of the logarithm of the product of the magnitudes, namely, $$\log_2 \prod_{i=0}^{N-1} X(K - i) \tag{3}$$

In turn, the output from summer 303 is supplied to amplifier 304 which has a gain of 1/N to yield $$\frac{1}{N} \log_2 \prod_{i=0}^{N-1} X(K - i), \text{ or} \tag{4}$$

$$\log_2 \left[ \prod_{i=0}^{N-1} X(K - i) \right]^{\frac{1}{N}} \tag{5}$$

Then, the output from amplifier 304 is supplied to amplifier 305 to generate $$2 \log_2 \left[ \prod_{i=0}^{N-1} X(K - i) \right]^{\frac{1}{N}} \tag{6}$$

or the logarithm of PL(X) of equation 2, namely $$\log_2 PL(X). \tag{7}$$

In practice, amplifiers 304 and 305 can be combined. The $\log_2 PL(X)$ output from amplifier 305 is supplied to selector 204 (FIG. 2). The article entitled, "A Tweleve-Channel Digital Echo Canceler" noted above discloses a similar arrangement for generating the long term, i.e., average power estimate PL(X).

FIG. 4 shows in simplified form one embodiment of fast attack estimator 202 for generating an estimate of a second prescribed characteristic of X(K), namely, a so-called fast attack power estimate PS(X). Received signal X(K) typically includes samples of a signal in digital form, each representative of a μ-law quantized amplitude sample. Each such digital sample representation includes a sign bit, three segment bits and four step bits.

As described in the copending application Ser. No. 393,122, a mean square power estimate of the transient or pulsating signal is desired. It is known that peak power is approximately related to the mean square estimate by a so-called crest or peak factor γ, namely, $$P(X) \frac{P(X)MAX}{\gamma^2}. \tag{8}$$

It is also known that subtraction is simpler than multiplication. Therefore, if representations of the logarithms of P(X)MAX and $\gamma^2$ are available, the desired mean square fast attack power estimate PS(X) is obtainable by subtracting the logarithms. As indicated above, the segment bits of μ-law digital samples are an approximate representation of the log base 2 of the corresponding sample magnitude.

Accordingly, as shown in FIG. 4, received signal sample X(K) is supplied to segment extractor 401 for obtaining the segment bits of the received samples. This is readily realized by employing a corresponding plurality of gates which are enabled to pass only the three segment bits to delay elements 402-1, and, in turn, to delay elements 404-2 through 402-N. Delay elements 402 may be a shift register for storing N delayed replicas of the segment bits XS(K), namely XS(K−1) through XS(K−N+1). As described above, segment bits XS(K) through XS(K'N+1) are approximately representative of the logarithms of the magnitudes of the corresponding samples. The maximum of signals XS(K) through XS(K−N+1) is obtained via maximum selector 403 in well known fashion and, in turn, supplied via amplifier 404 to a summing input of summer 405. Amplifier 404 has a gain in this example of two (2). Consequently, the output of amplifier 404 is approximately $2 \log_2 X(K-)MAX$ or representative of $\log_2 P(X)MAX$. Signal β is supplied to a subtracting input of summer 405. Signal $\beta$ is selected to be $2\log_2\gamma^2$ where $\gamma$ is the crest or peak factor, in this example, selected for a speech signal. Such a crest or peak factor value is readily obtained by a computer simulation in well known fashion. Thus, an output from summer 405 is approximately representative of $\log_2 PS(X)$, where $PS(X)$ is the desired fast attack power estimate. The $\log_2 PS(X)$ signal is supplied to one input of divider 203 (FIG. 2).

What is claimed is:

1. In an adaptive transversal filter of the type including:

a plurality of means each for generating a corresponding one of a plurality of amplitude coefficient signals, said plurality of amplitude coefficient signals forming an impulse response, each of said amplitude coefficient signal generating means including controllable gain means responsive to a normalization control signal for normalizing gain used in updating said corresponding amplitude coefficient signal;

means for generating said normalization control signal including, means responsive to a received signal for generating a first normalization signal representative of a first prescribed characteristic of the received signal, means responsive to the received signal for generating at least a second normalization signal representative of at least a second prescribed characteristic of the received signal, and means for selecting in accordance with a prescribed criterion either said first normalization signal or said at least second normalization signal as said normalization control signal.

2. The invention as defined in claim 1 wherein said first prescribed characteristic is a first prescribed power estimate and said at least second prescribed characteristic is a second prescribed power estimate.

3. The invention as defined in claim 2 wherein said first power estimate is a long term power estimate and said second power estimate is a fast attack power estimate.

4. The invention as defined in claim 3 wherein said long term power estimate is the mean power of the received signal and wherein said fast attack power estimate is a representation of maximum power of the received signal.

5. The invention as defined in claim 4 wherein said selecting means includes means for selecting the larger value of said long term power estimate and said fast attack power estimate as the normalization control signal.

6. The invention as defined in claim 1 further including means for scaling said at least second normalization signal by a predetermined value.

7. The invention as defined in claim 6 wherein said selecting means select the larger value of said first normalization signal or said scaled at least second normalization signal as the normalization control signal.

8. The invention as defined in claim 1 wherein the received signal includes a sequence of amplitude samples, said first normalization signal generating means includes means for generating an average power representation of a predetermined number of the received signal sample magnitudes, and said second normalization signal generating means includes means for generating a representation of a maximum power estimate of the predetermined number of received signal sample magnitudes.

9. The invention as defined in claim 8 further including means for scaling said maximum power estimate representation by a predetermined value, and wherein said selecting means include means for selecting the larger of the average power or the modified maximum power representations as the normalization control signal.

* * * * *